US008511422B2

(12) United States Patent
Adams

(10) Patent No.: US 8,511,422 B2
(45) Date of Patent: *Aug. 20, 2013

(54) FLEXIBLE MULTIPLE SPEAKER SUPPORT APPARATUS

(76) Inventor: Steven L. Adams, Leander, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/020,112

(22) Filed: Feb. 3, 2011

(65) Prior Publication Data

US 2011/0120799 A1 May 26, 2011

Related U.S. Application Data

(63) Continuation of application No. 11/476,482, filed on Jun. 29, 2006, now Pat. No. 7,886,867.

(51) Int. Cl.

| | |
|---|---|
| ***A47B 81/06*** | (2006.01) |
| ***G10K 11/00*** | (2006.01) |
| ***H04R 1/02*** | (2006.01) |
| ***H04R 1/20*** | (2006.01) |
| ***H04R 9/06*** | (2006.01) |
| ***H05K 5/00*** | (2006.01) |

(52) U.S. Cl.

USPC ........... 181/148; 181/144; 181/145; 181/147; 181/196; 181/197; 181/199; 381/335; 381/336; 381/338; 381/339; 381/386; 381/387; 381/392

(58) Field of Classification Search

USPC ......... 181/148, 144, 196, 197, 199; 381/335, 381/336, 338, 339, 386, 387, 392

See application file for complete search history.

(56) References Cited

U.S. PATENT DOCUMENTS

| | | | | |
|---|---|---|---|---|
| 1,908,172 | A * | 5/1933 | Nicolson | 381/186 |
| 3,135,348 | A * | 6/1964 | Bill | 181/147 |
| 4,179,008 | A * | 12/1979 | LeTourneau | 181/147 |
| 4,660,728 | A * | 4/1987 | Martin | 211/118 |
| 5,749,137 | A * | 5/1998 | Martin | 29/434 |
| 6,176,346 | B1 * | 1/2001 | Wiener | 181/199 |
| 6,640,924 | B2 * | 11/2003 | Messner | 181/144 |
| 6,652,046 | B2 * | 11/2003 | Christner | 312/111 |
| 7,886,867 | B2 * | 2/2011 | Adams | 181/148 |
| 2006/0065476 | A1 * | 3/2006 | Tasker | 181/155 |
| 2007/0284183 | A1 * | 12/2007 | Whitaker | 181/150 |

* cited by examiner

*Primary Examiner* — David Warren
*Assistant Examiner* — Christina Russell

(57) ABSTRACT

A flexible multiple speaker support apparatus is provided for supporting a plurality of speakers therein and includes a flexible, hollow speaker support unit which includes a plurality of open, sound emission channels. The speakers are housed within the flexible, hollow speaker support unit, and the speakers are placed in registration with the open, sound emission channels. With one embodiment of the invention, the flexible, hollow speaker support unit includes a flexible, tubular speaker support member, and the flexible, tubular speaker support member includes a plurality of the open, sound emission channels. The speakers are placed in registration with the open, sound emission channels. With another embodiment of the invention, a suspension bracket assembly is connected to the flexible, hollow speaker support unit for supporting the flexible, hollow speaker support unit in a desired orientation from a ceiling, wall or other surface.

4 Claims, 6 Drawing Sheets

FIG 3
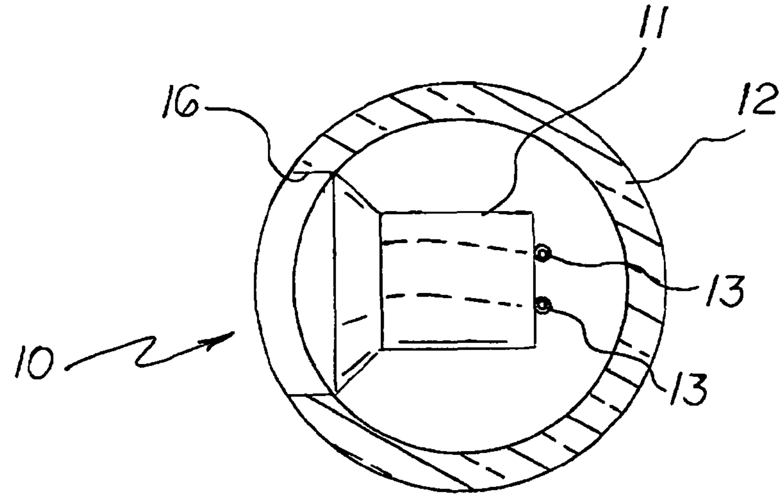
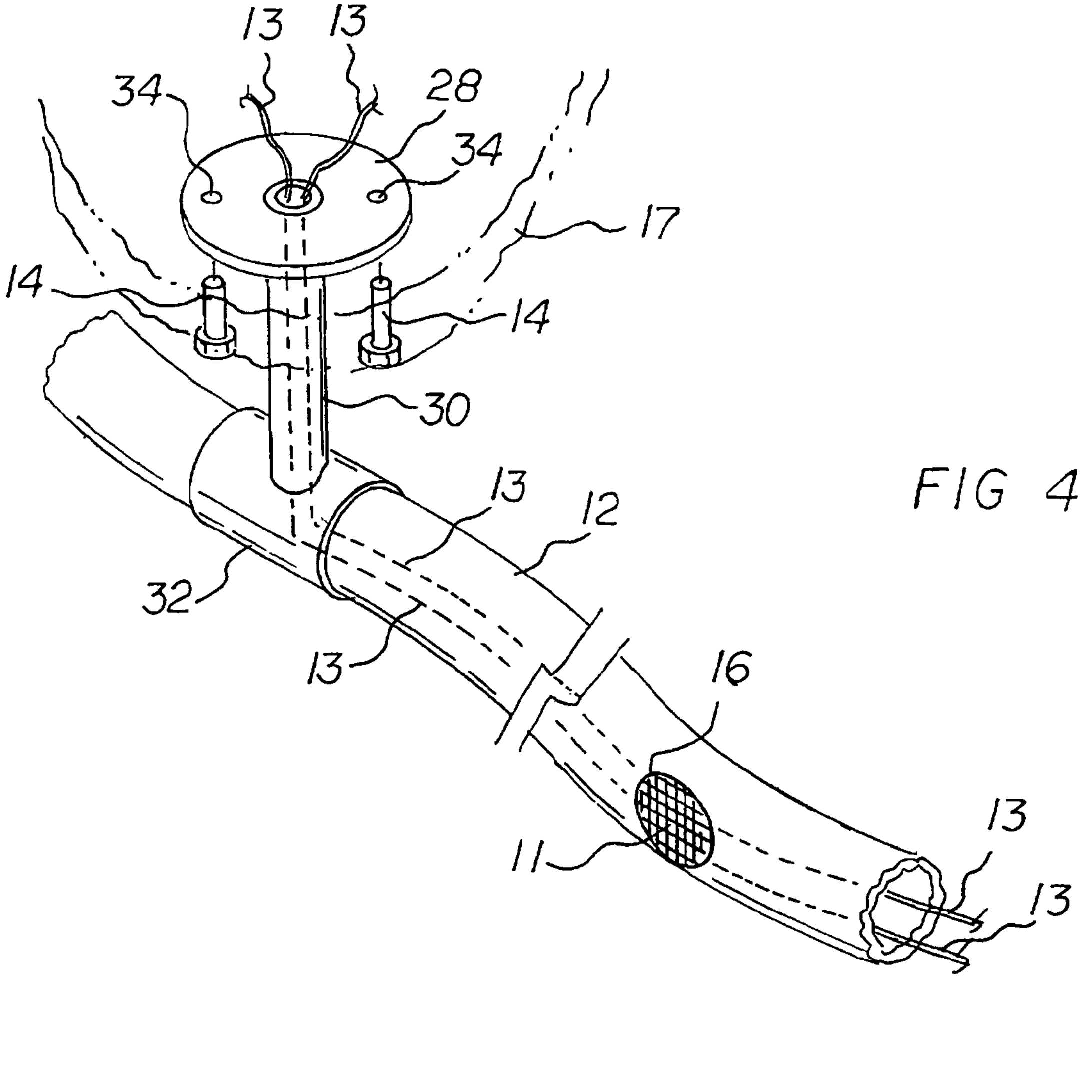
FIG 4

FIG 7
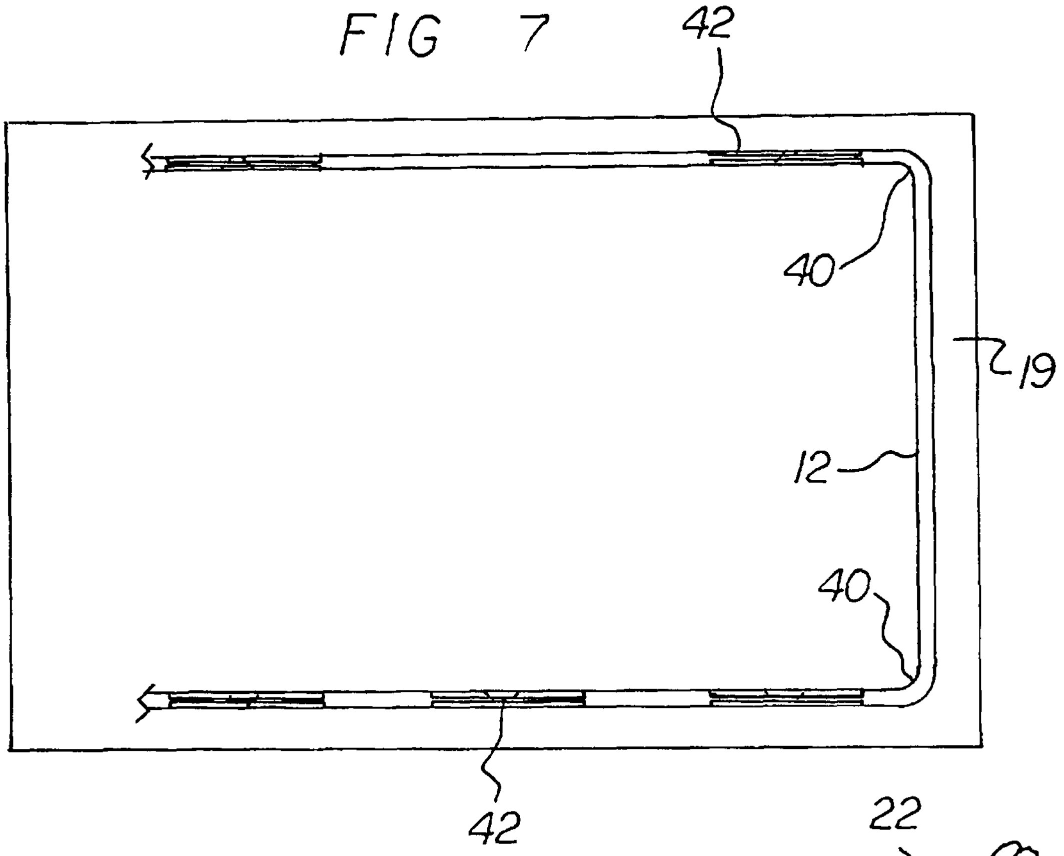
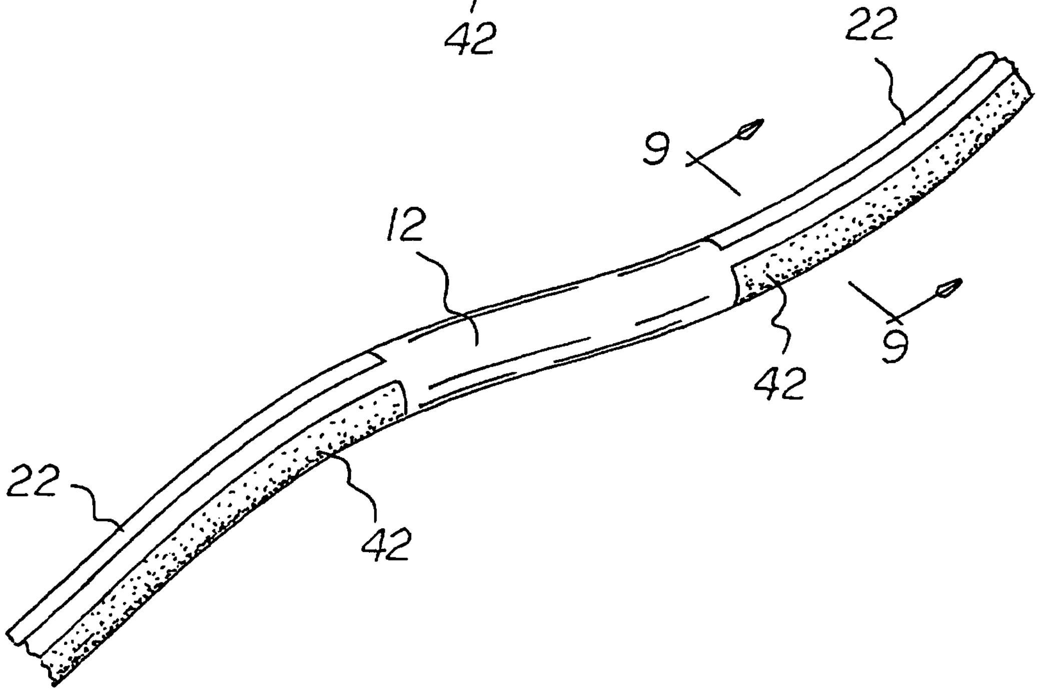
FIG 8

FIG 9
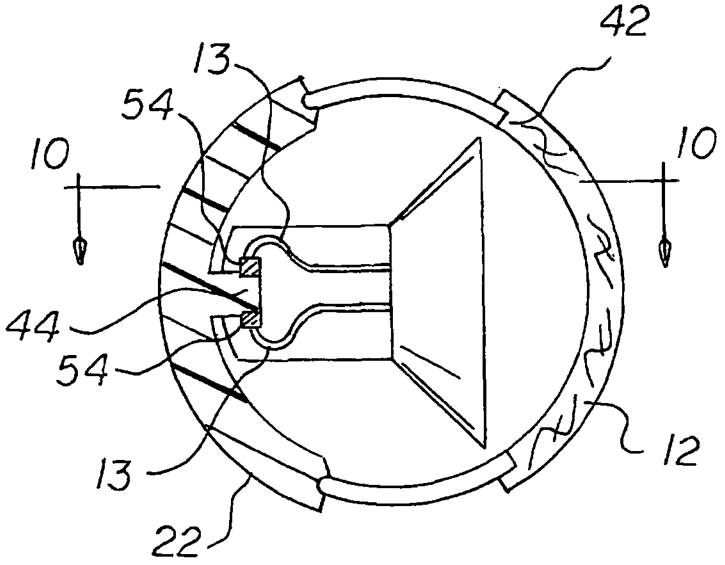
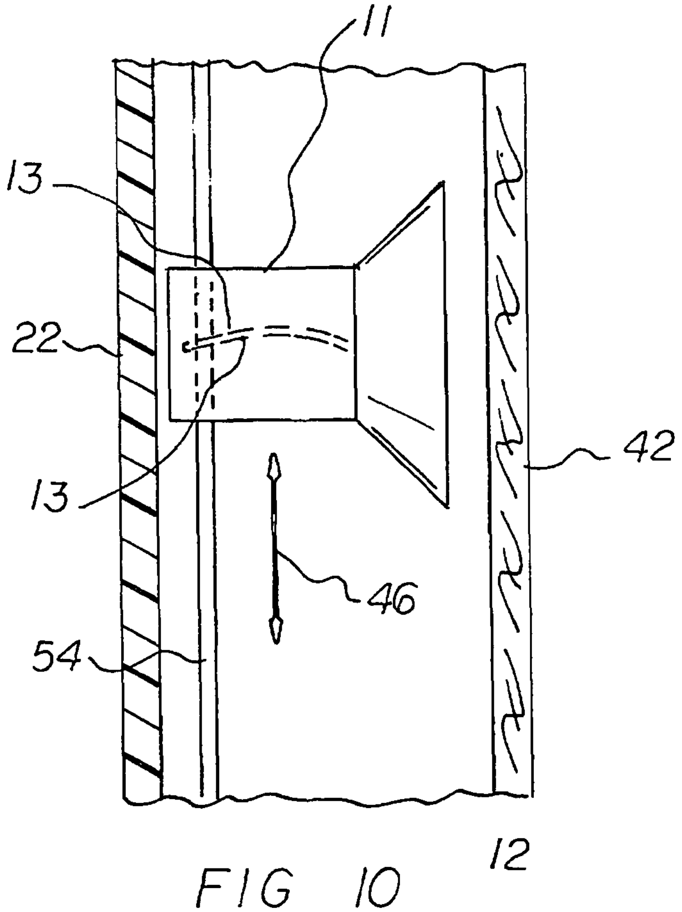
FIG 10

FIG 11
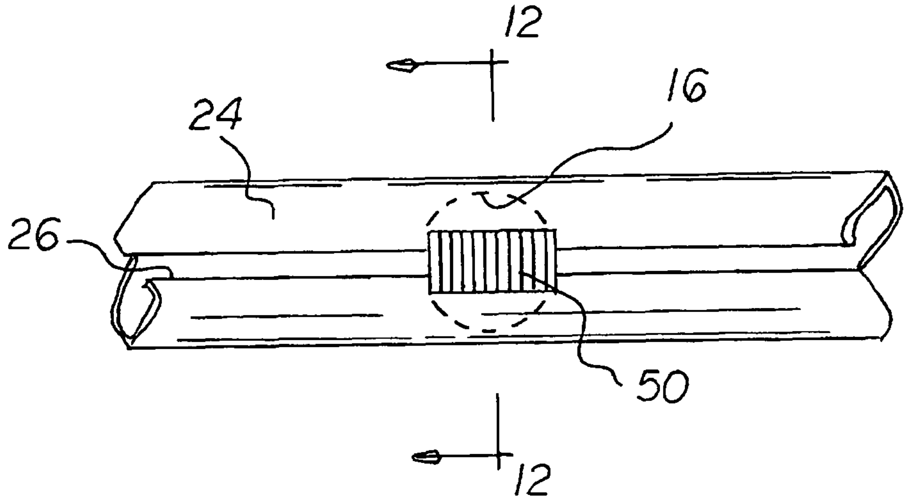
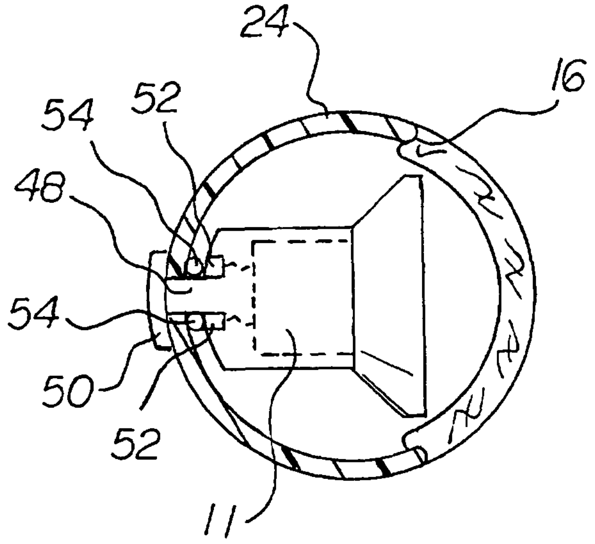
FIG 12

FLEXIBLE MULTIPLE SPEAKER SUPPORT APPARATUS

This application claims priority of and is a continuation of application Ser. No. 11/476,482 filed May 29, 2006 and titled "Flexible Multiple Speaker Support Apparatus", and the entire contents of the same are hereby incorporated by reference in this continuation application as if expressly set forth. The present invention relates generally to supports for multiple audio speakers, and, more particularly, to supports that are especially adapted for supporting multiple audio speakers in any desired orientation.

BACKGROUND OF THE INVENTION

1. Field of the Invention
2. Description of the Prior Art

Supporting multiple or plural audio speakers is well known in the art. In this respect, throughout the years, a number of innovations have been developed relating to supporting multiple speakers, and the following U.S. patents are representative of some of those innovations: U.S. Pat. Nos. 1,908,172, 4,660,728, 5,749,137, 6,640,924, and 6,652,046.

More specifically, U.S. Pat. No. 1,908,172 discloses a sound reproducing device which has a rigid multiple speaker support system. A plurality of speakers are suspended from the rigid support device, and the speakers extend out externally of the device. To provide greater applicability of a multiple speaker support device, it would be desirable if a multiple speaker support device were flexible. With a flexible multiple speaker support device, the support could be wrapped around corners in a room. With a rigid speaker support device, corners in a room cannot be wrapped around.

U.S. Pat. No. 4,660,728 discloses flying sound systems in which multiple speakers are suspended from an overhead support. To suspend the speakers, each of the speakers must have external brackets that connect to support cables. In addition, a pair of tension cables are used to suspend the multiple speakers. The tension cables opposed the force of gravity that tends to pull down the multiple speakers. Rather than installing external cable connection brackets to multiple speakers, it would be desirable if a multiple speaker support device were provided which does not require the use of cable connection brackets connected to multiple speakers. In addition, it may be desirable to suspend multiple speakers in a horizontal orientation. This patent does not provide for suspending multiple speakers from a horizontal orientation. Only suspension from a vertical orientation is provided with this speaker suspension device.

U.S. Pat. No. 5,749,137 discloses a method for suspending a plurality of speakers in a horizontal orientation. Each of the speakers is equipped with externally installed speaker-to-speaker connection brackets and an externally installed speaker-to-wall connection bracket. To avoid the need to install externally installed speaker-to-speaker connection brackets and externally installed speaker-to-wall connection brackets on multiple speakers, it would be desirable if a multiple speaker support device were provided that does require externally installed speaker-to-speaker connection brackets and externally installed speaker-to-wall connection brackets.

U.S. Pat. No. 6,640,924 discloses a rigging system for a plurality of loudspeakers supported in vertical orientation from an overhead support. This system does not provide for support of a plurality of loudspeakers in a horizontal orientation.

U.S. Pat. No. 6,652,046 discloses a system for suspending a plurality of loudspeakers in a vertical orientation. Aside from requiring externally installed cable-reception brackets, and aside from including a pair of tensioning cables, this rigging system employs two independent tensioning devices. A first tensioning device controls tension in a first cable, and a second tensioning device controls tension is a second cable. In this respect, to avoid such inherent complexities, it would be desirable if a multiple speaker support device were provided which does not require a pair of tension cable controlling devices for controlling a pair of tension cables.

Still other features would be desirable in a multiple speaker support device. For example, it would be desirable if a multiple speaker support device were provided which is relatively long and continuous for supporting plural or multiple speakers therein.

In this respect, it would be desirable if a multiple speaker support device were provided that is relatively long and continuous for supporting plural or multiple speakers therein and that has plural open sound emission channels for permitting sound to exit from the speakers from the long and continuous speaker support.

At times, it may be desirable to support multiple speakers in a horizontal orientation from an overhead horizontal support. At other times, it may be desirable to support multiple speakers in a horizontal, vertical or other orientation from a support. Therefore, it would be desirable to provide a multiple speaker support device which has embodiments to permit the device to be supported by an overhead horizontal support or a vertical support or a support having an angular orientation.

Thus, while the foregoing body of prior art indicates it to be well known to use multiple speaker support devices, the prior art described above does not teach or suggest a multiple speaker support apparatus which has the following combination of desirable features: (1) is flexible; (2) provides a support that can be wrapped around corners in a room; (3) does not require the use of cable connection brackets connected to multiple speakers; (4) permits the suspension of multiple speakers in a horizontal, vertical or other orientation; (5) does not require externally installed speaker-to-speaker connection brackets and externally installed speaker-to-wall connection brackets to be installed on multiple speakers; (6) does not require a pair of tension cable controlling devices for controlling a pair of tension cables; (7) is relatively continuous for supporting plural or multiple speakers therein; (8) has plural open, sound emission channels for permitting sound to exit from the speakers from a continuous speaker support of any desired longitudinal extent; and (9) permits support of multiple speakers in a horizontal, vertical or other orientation from a support. The foregoing desired characteristics are provided by the unique flexible multiple speaker support apparatus of the present invention as will be made apparent from the following description thereof. Other advantages of the present invention over the prior art also will be rendered evident.

SUMMARY OF THE INVENTION

To achieve the foregoing and other advantages, the present invention, briefly described, generally provides a flexible multiple speaker support apparatus is provided for supporting a plurality of audio speakers therein and includes a flexible, hollow speaker support unit which includes a plurality of open, sound emission channels. The audio speakers are housed within the flexible, hollow speaker support unit, and the speakers are placed in registration with the open, sound emission channels.

With one embodiment of the invention, the flexible, hollow speaker support unit includes a flexible, tubular speaker support member, and the flexible, tubular speaker support member includes a plurality of the open, sound emission channels. The speakers are placed in registration with the open, sound emission channels.

With another embodiment of the invention, a suspension bracket assembly is connected to the flexible, hollow speaker support unit for supporting the flexible, hollow speaker support unit in a desired orientation from a supporting surface such as a ceiling or a wall.

Preferably, the suspension bracket assembly includes a suspension plate portion, a riser portion connected to the suspension plate portion, and a tubular clamp portion connected to the riser portion. The flexible, hollow speaker support unit is clamped by the clamp portion for retaining the flexible, hollow speaker support unit in a desired orientation.

With another embodiment of the invention, the flexible, hollow speaker support unit includes a plurality of interconnected head and tail modular telescopic support units.

Preferably, the head and tail modular telescopic support units include first head and tail modular telescopic support units and second head and tail modular telescopic support units. The first head and tail modular telescopic support units and the second head and tail modular telescopic support units are connected together serially in head-to-tail fashion.

Either the first head and tail modular telescopic support units or the second head and tail modular telescopic support units include the open, sound emission channels.

With another embodiment of the invention, the flexible, hollow speaker support unit includes a quantity of external adhesive.

With another embodiment of the invention, the open, sound emission channels are in the form of elongated sound emission slots.

With another embodiment of the invention, a speaker carrier tongue is located on an inside surface of the flexible, tubular speaker support member. The speaker carrier tongue is positioned in registration with the elongated sound emission slots.

Preferably, the speaker carrier tongue includes a pair of conductive paths for connecting with respective conductor wires and complementary electrical contacts on the speakers.

With another embodiment of the invention, The flexible, hollow speaker support unit is in the form of a C-shaped tube which includes open slot. each of the speakers includes tongue engagement means for engaging the open slot.

Preferably, the tongue engagement means include a leg portion that is connected to a respective speaker, which extends through the open slot, and includes a foot portion that is connected to the leg portion, for fixing the respective speaker at a selected longitudinal position along the open slot. Preferably, conductive paths are attached to the leg portion, and complementary electrical contacts are electrically connected to the conductor wires of the speakers.

The above brief description sets forth rather broadly the more important features of the present invention in order that the detailed description thereof that follows may be better understood, and in order that the present contributions to the art may be better appreciated. There are, of course, additional features of the invention that will be described hereinafter and which will be for the subject matter of the claims appended hereto.

In this respect, before explaining a number of preferred embodiments of the invention in detail, it is understood that the invention is not limited in its application to the details of the construction and to the arrangements of the components set forth in the following description or illustrated in the drawings. The invention is capable of other embodiments and of being practiced and carried out in various ways. Also, it is to be understood, that the phraseology and terminology employed herein are for the purpose of description and should not be regarded as limiting.

As such, those skilled in the art will appreciate that the conception, upon which disclosure is based, may readily be utilized as a basis for designing other structures, methods, and systems for carrying out the several purposes of the present invention. It is important, therefore, that the claims be regarded as including such equivalent constructions insofar as they do not depart from the spirit and scope of the present invention.

It is therefore an object of the present invention to provide a new and improved flexible multiple speaker support apparatus which has all of the advantages of the prior art and none of the disadvantages.

It is another object of the present invention to provide a new and improved flexible multiple speaker support apparatus which may be easily and efficiently manufactured and marketed.

It is a further object of the present invention to provide a new and improved flexible multiple speaker support apparatus which is of durable and reliable construction.

An even further object of the present invention is to provide a new and improved flexible multiple audio speaker support apparatus which is susceptible of a low cost of manufacture with regard to both materials and labor, and which accordingly is then susceptible of low prices of sale to the consuming public, thereby making such flexible multiple speaker support apparatus available to the buying public.

Still yet a further object of the present invention is to provide a new and improved flexible multiple speaker support apparatus which is flexible.

Still another object of the present invention is to provide a new and improved flexible multiple speaker support apparatus that provides a support that can be wrapped around corners in a room.

Yet another object of the present invention is to provide a new and improved flexible multiple speaker support apparatus which does not require the use of cable connection brackets connected to multiple speakers.

Even another object of the present invention is to provide a new and improved flexible multiple speaker support apparatus that permits the suspension of multiple speakers in a desired orientation.

Still a further object of the present invention is to provide a new and improved flexible multiple speaker support apparatus which does not require externally installed speaker-to-speaker connection brackets and externally installed speaker-to-wall connection brackets to be installed on multiple speakers.

Yet another object of the present invention is to provide a new and improved flexible multiple speaker support apparatus that does not require a pair of tension cable controlling devices for controlling a pair of tension cables.

Still another object of the present invention is to provide a new and improved flexible multiple speaker support apparatus which is relatively long and continuous for supporting plural or multiple speakers therein.

Yet another object of the present invention is to provide a new and improved flexible multiple speaker support apparatus that has plural open, sound emission channels for permitting sound to exit from the speakers from a long and continuous speaker support.

Still a further object of the present invention is to provide a new and improved flexible multiple speaker support apparatus that permits support of multiple speakers in a desired orientation from a suitable support.

These together with still other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there are illustrated preferred embodiments of the invention.

BRIEF DESCRIPTION OF THE DRAWINGS

The invention will be better understood and the above objects as well as objects other than those set forth above will become more apparent after a study of the following detailed description thereof. Such description makes reference to the annexed drawing wherein:

FIG. 3 is an enlarged cross-sectional view of the embodiment of the flexible multiple speaker support apparatus of FIG. 1 taken along line 3-3 thereof.

FIG. 4 is a perspective view of a portion of a second embodiment of the invention which is supported by a support assembly.

FIG. 7 is a side view of a fourth embodiment of the invention which includes a quantity of external adhesive for adhering the embodiment of the invention onto a vertically oriented surface such as wall.

FIG. 8 is a perspective view of a portion of the embodiment of the invention shown in FIG. 7.

FIG. 9 is an enlarged cross-sectional view of the embodiment of the invention shown in FIG. 8, taken along line 9-9 thereof.

FIG. 10 is a cross-sectional view of the embodiment of the invention shown in FIG. 9, taken along line 9-9 thereof.

FIG. 11 is a side view of a fifth embodiment of the invention which includes a C-shaped tube having an open slot between two inside edges of the C-shaped tube.

FIG. 12 is an enlarged cross-sectional view of the embodiment of the invention shown in FIG. 11, taken along line 12-12 thereof.

DESCRIPTION OF THE PREFERRED EMBODIMENT

With reference to the drawings, a new and improved flexible multiple speaker support apparatus embodying the principles and concepts of the present invention will be described.

Figure 1:
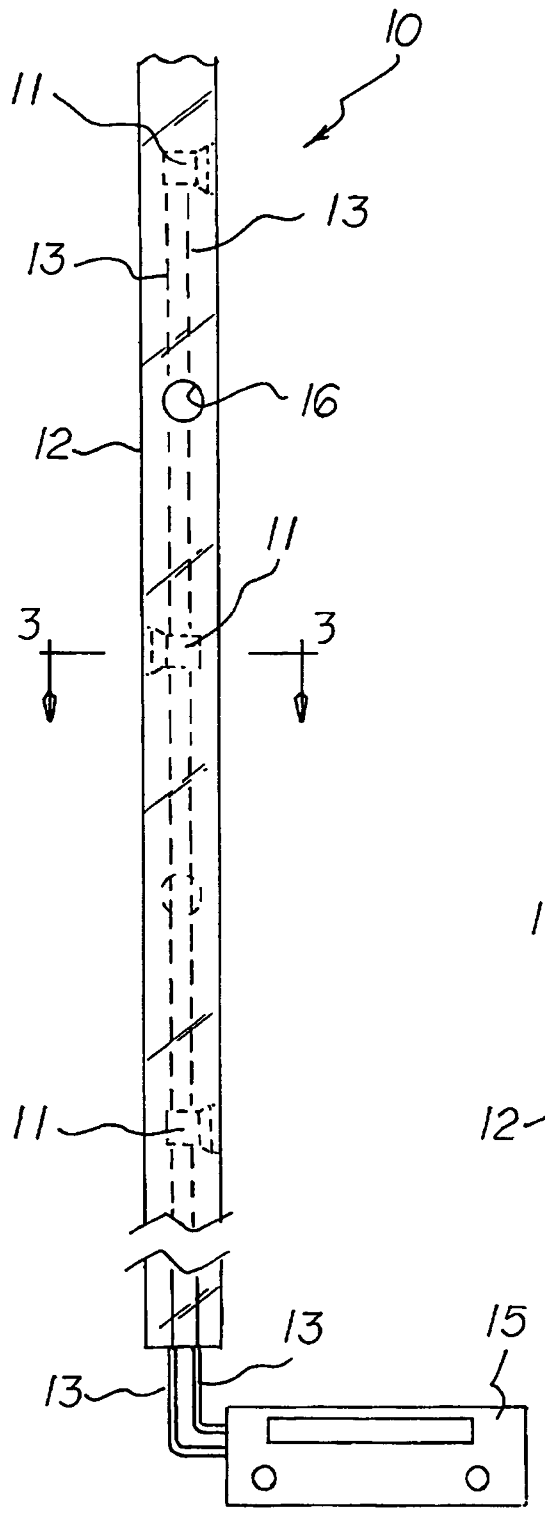
FIG. 1 is a partial side view showing a first embodiment of the flexible multiple speaker support apparatus of the invention in a straight, vertical orientation.
Figure 2:
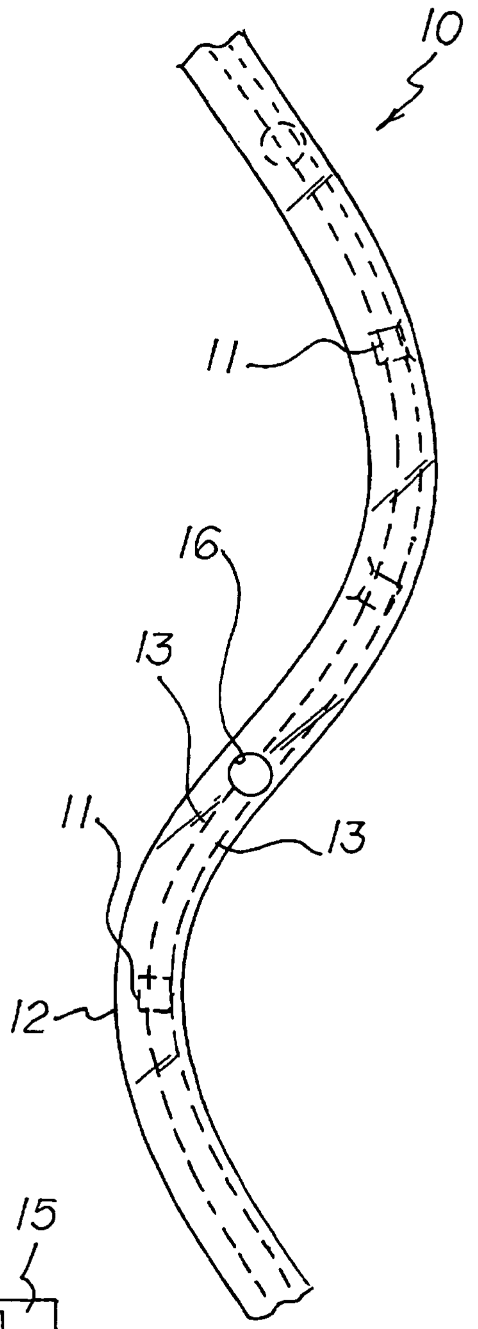
FIG. 2 is a side view of a portion of the embodiment of the flexible multiple speaker support apparatus shown in FIG. 1 in a curved, vertical orientation.

Turning to FIGS. 1-3, there is shown a first embodiment of the flexible multiple speaker support apparatus of the invention generally designated by reference numeral 10. In each of the figures, reference numerals are shown that correspond to like reference numerals that designate like elements shown in other figures.

Generally, a flexible multiple speaker support apparatus 10 is provided for supporting a plurality of speakers 11 therein and includes a flexible, hollow speaker support unit which includes a plurality of open, sound emission channels. The speakers 11 are housed within the flexible, hollow speaker support unit, and the speakers 11 are placed in registration with the open, sound emission channels 16. It is to be appreciated that the term "speakers" as used herein means conventional audio reproducers and may comprise any of the well known types such as moving coil, electrostatic, ionic or the like. The details of construction of such speaker units are well known and per se form no part of the present invention.

With one embodiment of the invention, as shown in FIGS. 1-3, the flexible, hollow speaker support unit includes a flexible, tubular speaker support member 12. The flexible, tubular speaker support member 12 includes a plurality of the open, sound emission channels 16. The speakers 11 are placed in registration with the open, sound emission channels 16. The open, sound emission channel 16 can be pre-formed as perforated areas in the flexible, tubular speaker support member 12. When a particular location for a speakers 11 is selected, the blank portion inside the perforations can be knocked out to provide an open, sound emission channel 16.

As shown in FIG. 1, if desired, the flexible, tubular speaker support member 12 can be oriented in a straight orientation. Alternatively, as shown in FIG. 2, the flexible, tubular speaker support member 12 can be oriented in a curvy, wavy manner. The flexible nature of the flexible, tubular speaker support member 12 permits this versatility of orientation.

With another embodiment of the invention, as shown in FIG. 4, a suspension bracket assembly is connected to the flexible, hollow speaker support unit for supporting the flexible, hollow speaker support unit in a horizontal orientation from an overhead horizontally oriented support. The overhead horizontally oriented support can be a horizontally oriented ceiling 17. It will be appreciated that the hollow speaker support unit for supporting the flexible, hollow speaker support unit can be adapted as well for vertical orientation on a vertical surface such as a wall or a plurality of wall surfaces, or for an orientation that extends at an angle to the horizontal or vertical.

Preferably, the suspension bracket assembly shown in FIG. 4 includes a suspension plate portion 28, a riser portion 30 connected to the suspension plate portion 28, and a tubular clamp portion 32 connected to the riser portion 30. The flexible, hollow speaker support unit, such as a flexible, tubular speaker support member 12, is clamped by the clamp portion 32 for retaining the flexible, hollow speaker support unit in a desired horizontal, vertical or other orientation.

As shown in FIG. 4, the suspension plate portion 28 can be secured to a ceiling or wall 17 using fasteners 14. In this respect, the suspension plate portion 28 includes fastener-reception channels 34 for receiving the fasteners 14.

Generally, electrical conductor wires 13, that provide power and audio signals to the speakers 11, are also housed in the flexible, hollow speaker support unit. As shown in FIG. 1, a stereo unit 15 can be used to power and provide audio signals to the speakers 11 through the conductor wires 13. In this respect, in the flexible, hollow speaker support unit, the speakers 11 can provide a form of "surround sound".

As shown in FIG. 4, the conductor wires 13 can extend through the clamp portion 32, the riser portion 30, and the suspension plate portion 28 into a power and audio signal source (not shown) in the ceiling, wall or other support 17.

With another embodiment of the invention, the flexible, hollow speaker support unit includes a plurality of interconnected head and tail modular telescopic support units.

Preferably, the head and tail modular telescopic support units include first head and tail modular telescopic support units 18 and second head and tail modular telescopic support units 20. The first head and tail modular telescopic support units 18 and the second head and tail modular telescopic support units 20 are connected together serially in head-to-tail fashion.

Either the first head and tail modular telescopic support units 18 or the second head and tail modular telescopic support units 20 include the open, sound emission channels 16.

Figure 5:
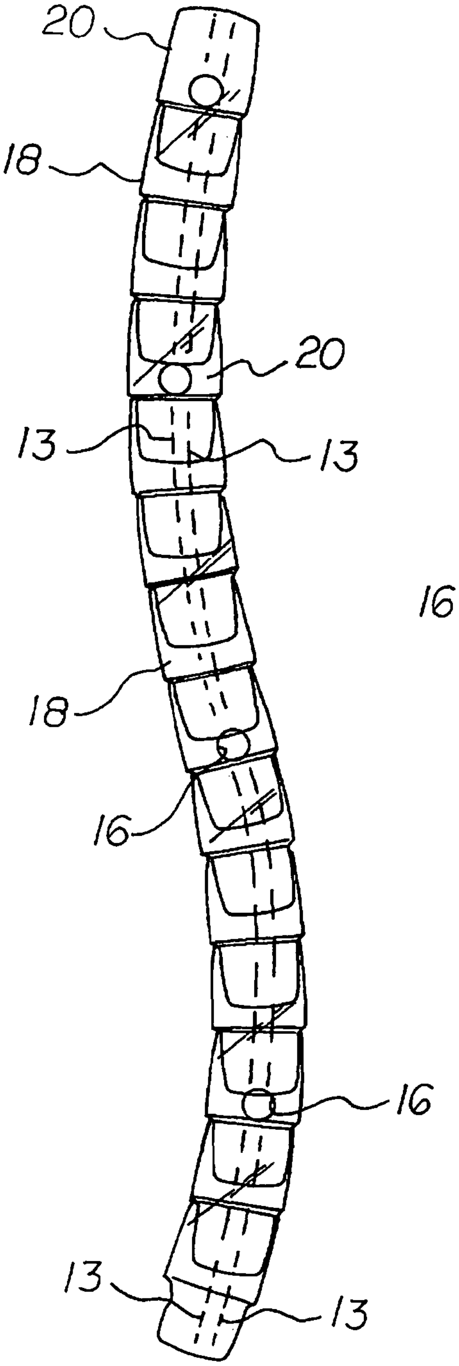
FIG. 5 is a side view of a portion of a third embodiment of the invention which includes a plurality of head and tail modular telescopic support units.
Figure 6:
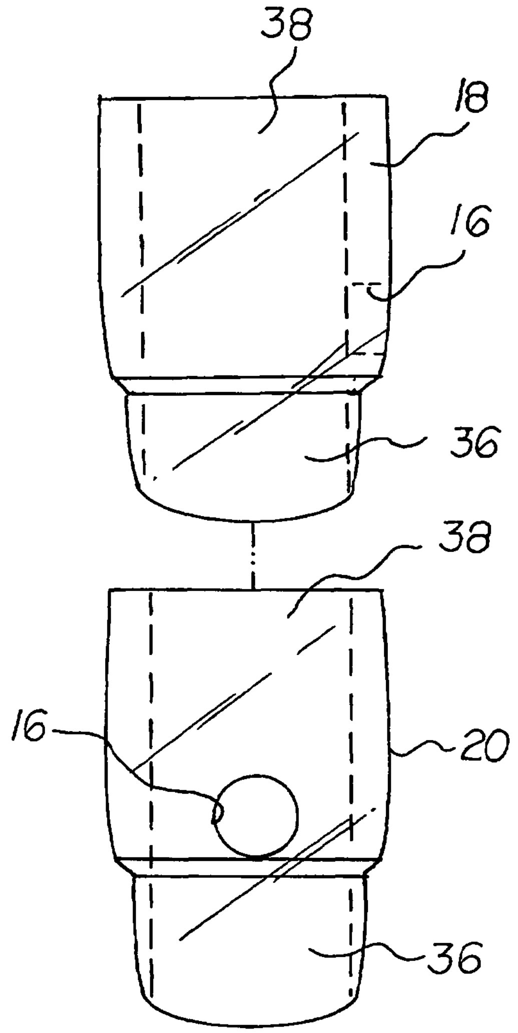
FIG. 6 is an enlarged partially exploded view of a first head and tail modular telescopic support unit and a second head and tail modular telescopic support unit.

As shown in FIGS. 5 and 6, a tail portion 36 of a respective head and tail modular telescopic support unit fits into a head portion 38 of a respective adjacent head and tail modular telescopic support unit. The successive fitting together of respective head and tail modular telescopic support units form the overall flexible, hollow speaker support unit formed in FIG. 5. Also, as shown in FIG. 5, the flexible, hollow speaker support unit forms a curvalinear shape.

With another embodiment of the invention, as shown in FIGS. 7-10, the flexible, hollow speaker support unit includes a quantity of external adhesive 22. The quantity of external adhesive 22 permits the flexible, tubular speaker support member 12 to be affixed to the vertically oriented wall 19. The quantity of external adhesive 22 can be applied directly to the flexible, tubular speaker support member 12, or, alternatively, the quantity of external adhesive 22 can be applied in the form of pieces of double-sided adhesive tape that are positioned along the length of the flexible, tubular speaker support member 12 at selected locations.

It is noted that in FIG. 7, the flexible nature of the flexible, tubular speaker support member 12 permits the flexible, tubular speaker support member 12 to be bent around corners 40. In this regard, it is possible with the present invention to advantageously form a typical "surround sound" configuration with front left and right speaker channels, a center front speaker channel, and rear left and right speaker channels, all substantially as depicted in FIG. 7. Also, as shown in FIGS. 7-10, the open, sound emission channels are in the form of elongated sound emission slots 42. The speakers 11 can be adjusted longitudinally along these elongated sound emission slots 42.

More specifically, preferably, a speaker carrier tongue 44 is located on an inside surface of the flexible, tubular speaker support member 12. The speaker carrier tongue 44 is positioned in registration with the elongated sound emission slots 42.

Preferably, the speaker carrier tongue 44 includes a pair of conductive paths 54 for connecting with respective conductor wires 13 and complementary electrical contacts on the speakers 11.

As shown in FIG. 10, the speakers 11 can be moved longitudinally along the speaker carrier tongue 44 as indicated by directional arrow 46. When this is done, electrical contact is preserved between the conductive paths 54 on the speaker carrier tongue 44 and the conductor wires 13 and electrical contacts on the speakers 11.

With another embodiment of the invention, as shown in FIGS. 11 and 12, the flexible, hollow speaker support unit is in the form of a C-shaped tube 24 which includes open slot 26. The open, sound emission channels 16 are positioned at selected locations along the C-shaped tube 24. The open slot 26 can serve as a tongue or track for speakers 11 to be slid longitudinally along. In this respect, each of the speakers 11 includes tongue engagement means for engaging the open slot 26.

Preferably, the tongue engagement means include a leg portion 48 that is connected to a respective speaker 11, which extends through the open slot 26, and includes a foot portion 50 that is connected to the leg portion 48, for fixing the respective speaker 11 at a selected longitudinal position along the open slot 26. Preferably, conductive paths 54 are attached to the leg portion 48, and complementary electrical contacts 52 are electrically connected to the conductor wires 13 of the speakers 11. As the speakers 11 are moved longitudinally along the open slot 26 in the C-shaped tube 24, the electrical contacts 52 that are connected to the speakers 11 maintain electrical contact with the complementary conductive paths 54 on the leg portion 48.

The components of the flexible multiple speaker support apparatus of the invention can be made from inexpensive and durable metal and plastic materials.

As to the manner of usage and operation of the instant invention, the same is apparent from the above disclosure, and accordingly, no further discussion relative to the manner of usage and operation need be provided.

It is apparent from the above that the present invention accomplishes all of the objects set forth by providing a new and improved flexible multiple speaker support apparatus that is low in cost, relatively simple in design and operation, and which is advantageously flexible. With the invention, a flexible multiple speaker support apparatus provides a support that can be wrapped around corners in a room. With the invention, a flexible multiple speaker support apparatus is provided which does not require the use of cable connection brackets connected to multiple speakers. With the invention, a flexible multiple speaker support apparatus is provided which permits the suspension of multiple speakers in a horizontal or other orientation. With the invention, a flexible multiple speaker support apparatus is provided which does not require externally installed speaker-to-speaker connection brackets and externally installed speaker-to-wall connection brackets to be installed on multiple speakers.

With the invention, a flexible multiple speaker support apparatus is provided which does not require a pair of tension cable controlling devices for controlling a pair of tension cables. With the invention, a flexible multiple speaker support apparatus is provided which is relatively long and continuous for supporting plural or multiple speakers therein. With the invention, a flexible multiple speaker support apparatus is provided which has plural open, sound emission channels for permitting sound to exit from the speakers from a long and continuous speaker support. With the invention, a flexible multiple speaker support apparatus is provided which permits support of multiple speakers in a horizontal orientation from an overhead horizontal support. With the invention, a flexible multiple speaker support apparatus is provided which permits support of multiple speakers in a horizontal, vertical or other orientation from a support.

Thus, while the present invention has been shown in the drawings and fully described above with particularity and detail in connection with what is presently deemed to be the most practical and preferred embodiment(s) of the invention, it will be apparent to those of ordinary skill in the art that many modifications thereof may be made without departing from the principles and concepts set forth herein, including, but not limited to, variations in size, materials, shape, form, function and manner of operation, assembly and use.

Thus, for example, it will be appreciated that the audio signals driving the speaker units in the flexible speaker support apparatus of the invention may be transmitted to the units using wireless transmission or so-called optical audio cables using fiber optic technology. Similarly, although the flexible support apparatus is intended to be used in a horizontal orientation to produce a wide sound source, the flexible supports contemplated herein may just as easily be employed in a vertical orientation on a wall surface or a plurality of separate wall surfaces, or worn individually on a person by wrapping around the head, neck or other body part.

Hence, the proper scope of the present invention should be determined only by the broadest interpretation of the appended claims so as to encompass all such modifications as well as all relationships equivalent to those illustrated in the drawings and described in the specification.

Finally, it is emphasized that the annexed Abstract is provided to comply with the rules requiring an abstract that will allow a searcher or other reader to quickly ascertain the subject matter of the technical disclosure herein. It is submitted with the understanding that it will not be used to interpret or limit the scope or meaning of the following claims.

What is claimed as being new and desired to be protected by Letters Patent of the United States is as follows:

1. Apparatus comprising a plurality of electrically-powered audio speakers, each audio speaker having at least a pair of speaker electrical connections configured to receive audio signals, each audio speaker having at least one audio speaker element in communication with the at least one speaker electrical connection to receive a respective speaker electrical input, each audio speaker element being operable to issue sound;

a pair of elongated electrical conductors extending to each pair of speaker electrical connections to convey audio signals to each audio speaker; and a flexible elongated speaker support unit configured to extend between a plurality of speaker locations, the flexible elongated speaker support unit configured to extend from each speaker to a next one of the plurality of speakers, intermediate the plurality of speakers the flexible elongated speaker support unit configured to support the pair of elongated electrical conductors, the flexible elongated speaker support unit being configured to support the plurality of speakers relative to a fixed support in an environment, the flexible elongated speaker support unit being selectively affixable to the fixed support in the environment to support the plurality of speakers relative to the fixed support, before being affixed to the fixed support the flexible elongated speaker support unit being unaffixed, when unaffixed the flexible elongated speaker support unit being configured for flexing to permit selective positioning of each speaker relative to the fixed support in the environment.

2. The apparatus of claim 1 and further comprising:

said pair of elongated electrical conductors being configured to connect the plurality of audio speakers to an electrically-powered audio signal source.

3. The apparatus of claim 1 and further comprising:

a suspension bracket assembly connected to said flexible, elongated speaker support unit for supporting said flexible, elongated speaker support unit in a substantially horizontal orientation from the fixed support.

4. The apparatus of claim 1 and further comprising:

said pair of elongated electrical conductors comprising a pair of elongated insulated wire electrical conductors.

* * * * *